United States Patent [19]

Wada et al.

[11] Patent Number: 4,488,221
[45] Date of Patent: Dec. 11, 1984

[54] DATA PROCESSING SYSTEM

[75] Inventors: Kenichi Wada, Zama; Takashige Kubo, Hachioji, both of Japan

[73] Assignee: Hitachi, Ltd., Tokyo, Japan

[21] Appl. No.: 361,265

[22] Filed: Mar. 24, 1982

[30] Foreign Application Priority Data

Mar. 25, 1981 [JP] Japan .................................. 56-42313

[51] Int. Cl.³ ............................................ G06F 11/00
[52] U.S. Cl. .................................................. 364/200
[58] Field of Search ... 364/200 MS File, 900 MS File; 371/8, 14, 16, 23

[56] References Cited

U.S. PATENT DOCUMENTS 3,873,819  3/1975  Greenwald ........................ 371/16
4,063,081  12/1977 Handly et al. ..................... 364/200
4,253,183  2/1981  Taylor et al. ....................... 371/29
4,270,168  5/1981  Murphy et al. .................... 371/16
4,315,311  2/1982  Causse et al. ...................... 371/16
4,410,984  10/1983 Negi et al. ......................... 371/16

Primary Examiner—Raulfe B. Zache
Assistant Examiner—David Y. Eng
Attorney, Agent, or Firm—Antonelli, Terry & Wands

[57] ABSTRACT

A data processing system in which a scan-in operation is initiated to scan in data for giving rise to occurrence of pseudo-failure in response to an address coincidence signal representative of a pseudo-failure signal. A one-shot suppression pulse signal is issued for inhibiting temporarily operation execution during a time span between the scan-in and the occurrence of failure.

10 Claims, 7 Drawing Figures

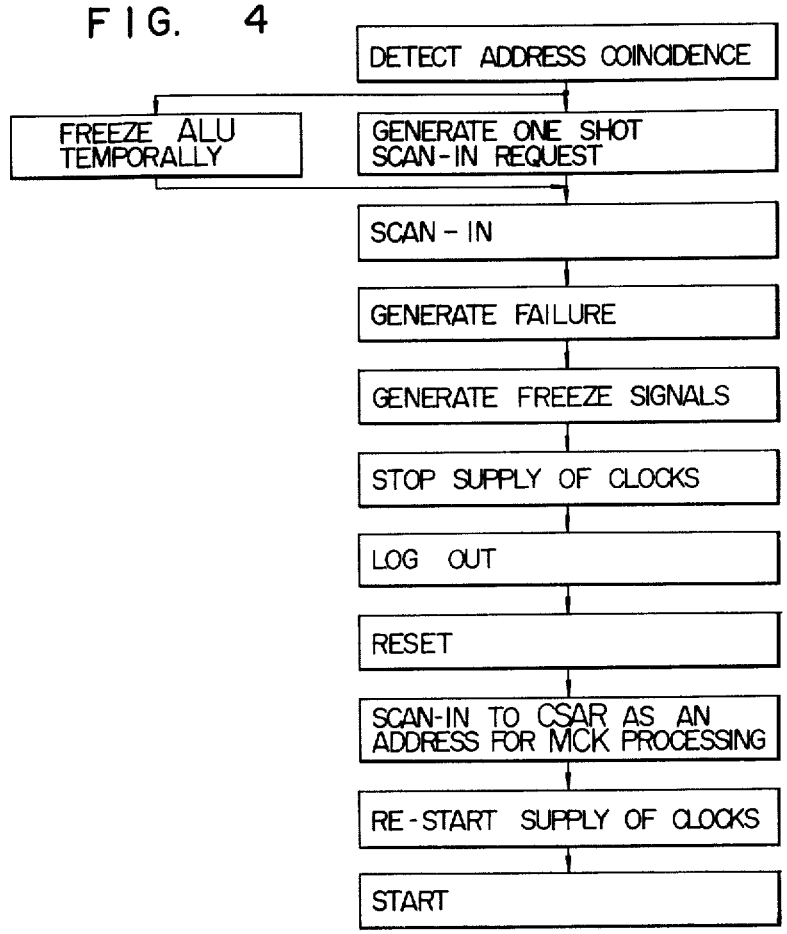
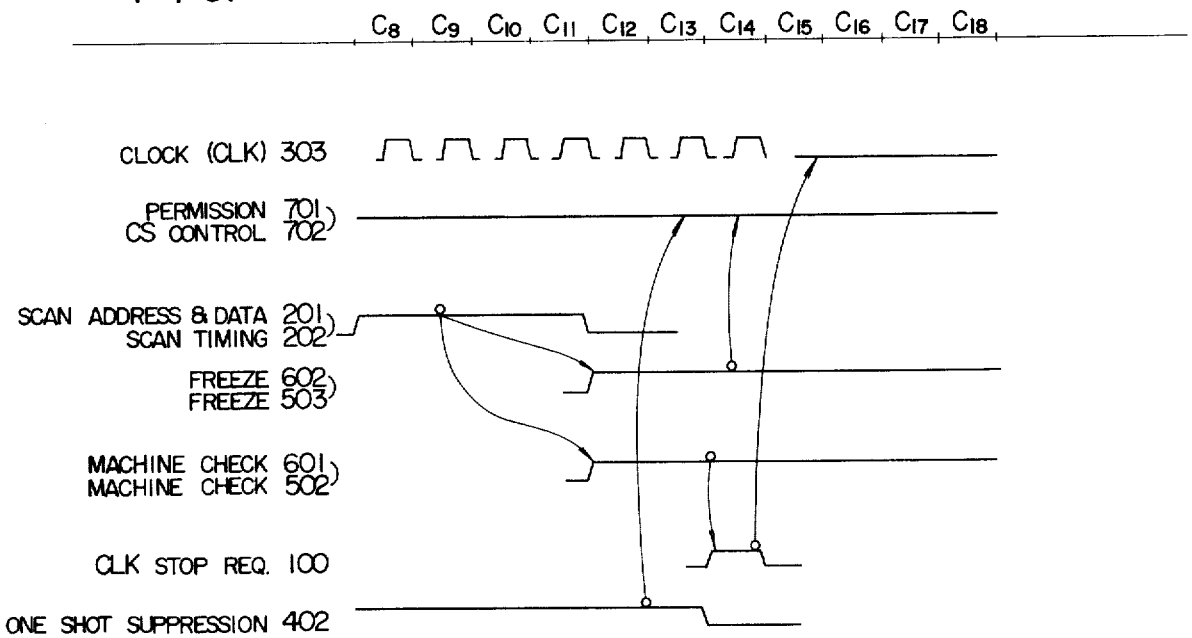

4,488,221

DATA PROCESSING SYSTEM

BACKGROUND OF THE INVENTION

The present invention relates generally to a high performance data processing system, such as a large scale digital computer, for general purpose and the like.

In the data processing system of high performance, there is adopted a highly sophisticated pipeline control system, wherein several instructions are usually executed in parallel.

What state will prevail in the data processing system upon occurrence of failure of an intermittent type or of a solid state circuit constituting the processing system is determined in dependence on a specific circuit in which the failure actually occurs and/or a particular instruction being executed. However, in the present state of technology in which the logic scale of the data processing system is more and more increased, it becomes more insufficient only to detect the circuit suffering the failure in order to determine or estimate what kinds of influences are invloved in the overall data processing system. Under the circumstances, when an apparatus serving for detection of failure and recovery of the system, referred to as a RAS (an abridgment of Reliability, Availability and Serviceability) mechanism is to be tested, it is necessary to examine or inspect the operations of the RAS mechanism by changing the condition to determine what kind of failure is caused to occur in what kind of circuit during the execution of what kind of instruction. In a data processing system, the number of circuits to be tested will be enormous. Further, since the number of instructions amounts to 100 or more, the possible instruction sequences will be numerous. Besides, even in an instruction sequence, the failure may occur in any machine cycle. Thus, the number of combinations of the testing conditions will reach astronomical figures.

In reality, since the test of all the possible combinations is impractical, those combinations which are necessary for detecting design errors and circuit errors of circuits with a relatively high failure probability are selected for the testing of the RAS mechanism.

For the test of the RAS mechanism of a data processing system there are thus required a pseudo-failure generating circuit as well as a circuit for controlling precisely the timing at which the pseudo-failure is generated. Otherwise, the test for the selected combination would not properly be carried out with useless tests being repeated, involving inefficiency in the test.

It is relatively easy to generate the pseudo-failure in a specific circuit. To this end, a scan-in circuit has been heretofore incorporated in the circuit to be tested for executing a scan-in operation for the testing. As is well known, the scan-in circuit is inherently destined to be used for the purpose of maintenance and diagnosis and provides set values in desired flip-flops which play no part in the normal operation. More specifically, the flip-flop is scanned by a pulse referred to as a scan-in timing puslse, so that the value of scan data is reflected by the state of the scanned flip-flop. Several types of scan-in systems are known. According to one of them, there is provided a scan data line independent of normal data lines, wherein the value of the scan data is set at a flip-flop of a single bit in a single scan timing, as will also be described hereinafter.

In order to insure that failure will occur in the state approximating the actual conditions of operation as closely as possible, coincidence of a predetermined address with the address of the instruction and/or the address of a microinstruction is detected to thereby trigger the activation of the scan-in circuit. This operation is referred to as the one-shot scan-in operation.

Even when the failure generating conditions are established as valid, the loading or setting of abnormal data in the circuit in which failure is caused to occur is accomplished only with a delay corresponding to 4 to 11 machine cycles due to the time required for signal transmission. As a consequence, the failure is generated only after the instruction for generating the failure has been executed, which means that the test is performed on the basis of conditions which are different from those on which the test should inherently be conducted.

Since the delay described above is not constant but varies in dependence on the packaged positions of the circuits in question, the instruction sequence to be executed must be so rearranged that execution of the instruction which involves the use of the circuit in question is effected in consideration of the applicable delay, so that the test can be performed for the combination of the instruction being executed upon occurrence of failure and the failed circuit.

SUMMARY OF THE INVENTION

An object of the present invention is to provide a data processing system in which a specified failure can take place precisely in the course of execution of a specified instruction contained in a program.

Another object of the present invention is to provide the data processing system of the above mentioned type without involving additional expense by making use of an existing scan-in mechanism.

According to an aspect of the invention, there is provided a data processing system in which a scan-in operation is initiated to scan in data for bringing about a pseudo-failure in response to a pseudo-failure generation ordering signal, for example an address coincidence signal. A one-shot suppression pulse signal is issued for inhibiting temporarily the arithmetic operation during a time span between the scan-in and the occurrence of pseudo-failure.

BRIEF DESCRIPTION OF THE DRAWINGS

FIG. 4 illustrates in a flow chart operations taking place in the system shown in FIG. 1 from a time point at which an address coincidence is detected to a time point at which clocking is restored.

FIG. 7 illustrates in a time chart major operations of the data processing system shown in FIG. 1 on other conditions.

DESCRIPTION OF THE PREFERRED EMBODIMENTS

Figure 1:
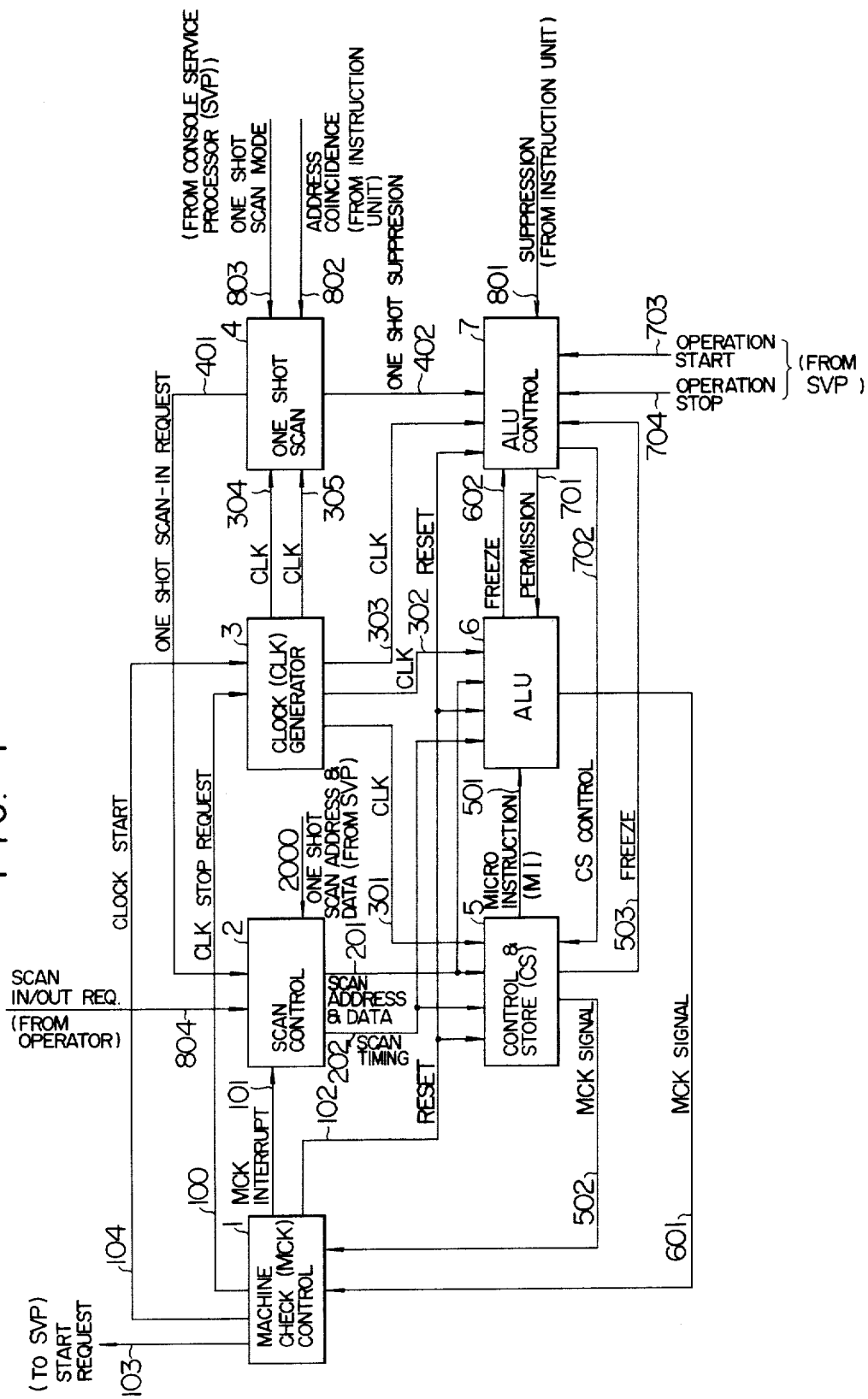
FIG. 1 shows schematically a general arrangement of a data processing system according to an exemplary embodiment of the invention.

Referring to FIG. 1, a control storage (CS) 5 in which microinstructions are stored is controlled by a control storage control signal (hereinafter referred to as a CS control signal) 702. Microinstruction 501 read out from the control storage 5 is used for controlling an arithmetic and logical unit (hereinafter referred to as ALU) 6. An ALU control circuit 7 issues to the ALU 6 for every machine cycle a permission signal 701 indicating whether the microinstruction as read out from the control storage 5 is to be executed or not by the ALU 6. The ALU control circuit 7 receives as inputs thereto an operation suppressing signal 801 supplied from a instruction unit (not shown), an operation start signal 703 and an operation stop signal 704 supplied from an external unit such as, for example, a service processor or SVP (not shown), a freeze signal 503 supplied from the control storage 5, a freeze signal 602 supplied from the ALU 6 and a one-shot suppression signal 402 supplied from a one-shot scan circuit 4, and produces as outputs therefrom the permission signal 701 and the CS control signal 702. A scan control circuit 2 is activated by a scan-in/out request signal 804, a one-shot scan-in request signal 401 or a machine check interrupt signal 101 (hereinafter also referred to as MCK INT) produced through manipulation by the operator and produces a scan timing signal 202, a scan address signal 201A and a data signal 201B. Such a scan control circuit 2 per se has hitherto been known. The one-shot scan circuit 4 receives as inputs thereto a one-shot scan mode signal 803 and an address coincidence signal 802 concerning the macro-instruction or the micro-instruction and produces the one-shot scan-in request signal 401 as in the case of the hitherto known system and additionally produces the one-shot suppression signal 402 characteristic of the invention when the address coincidence signal makes an appearance during the one-shot scan mode. When the one-shot scan-in request 401 is issued, the scan control circuit 2 is activated, whereby scan operation is initiated. A clock generator 3 produces for every machine cycle clock signals 301, 302 and 303 supplied to the control storage 5, the ALU 6 and the ALU control circuit 7, respectively, and additionally produces clock signals 304 and 305 supplied to the one-shot scan circuit 4.

Figure 2:
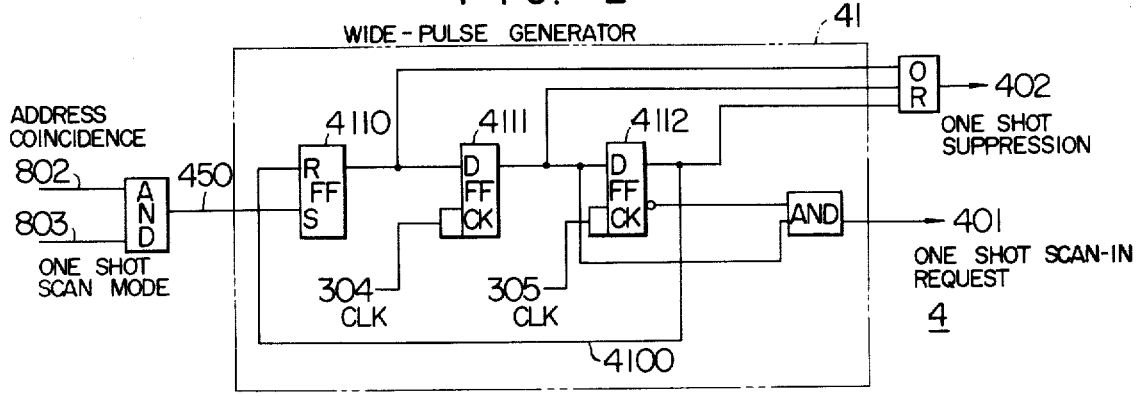
FIG. 2 shows a circuit diagram to illustrate a circuit configuration of a one-shot scan circuit used in the data processing system shown in FIG. 1.

Referring to FIG. 2 which shows details of the one-shot scan circuit 4 according to an exemplary embodiment of the invention, a logical AND signal 450 of the address coincidence signal 802 and the one-shot scan mode signal 803 is applied to the input of a wide-pulse generator 41 which responds to the logical AND signal 450 and clock signals 304 and 305 and produces as the output signals the one-shot scan-in request signal 401 and the one-shot suppression signal 402. The clocks 304 and 305 are 8-cycle clocks each produced once for eight machine cycles and having a pulse width equal to that of the other clocks 301, etc. It is however to be noted that the clock 304 is out of phase with the clock 305 by four machine cycles. The pulse generator 41 includes a flip-flop 4110 which is set by the signal 450 and reset by a signal 4100. Further, there is provided a flip-flop 4111 which serves to latch the output signal from the flip-flop 4110 in response to excitation of the clock signal 304. On the other hand, a flip-flop 4112 latches the output of the flip-flop 4111 upon excitation of the clock signal 305. The one-shot scan-in request signal 401 is obtained as the logical AND signal of the inverted output signal from the flip-flop 4112 and the output signal from the flip-flop 4111 and corresponds to a pulse derived by differentiating the leading edge of the output signal from the flip-flop 4111. This one-shot scan-in request pulse 401 is produced once in four cycles. Since the scan control circuit 2 is operated at a low speed in a base cycle corresponding to quadruple the operation cycle of the ALU 6, the one-shot scan-in request signal 401 is also a four cycle pulse signal. The one-shot suppression signal 402 is a logical OR signal of the outputs from the flip-flops 4110, 4111 and 4112 and has a pulse width corresponding to 12 to 16 cycles in dependence on the phase of the clock signal 304. By the way, since the flip-flop 4110 is instantaneously set in response to the application of the signal 450, the one-shot suppression signal 402 is produced immediately after the signal 450 is produced.

Figure 3:
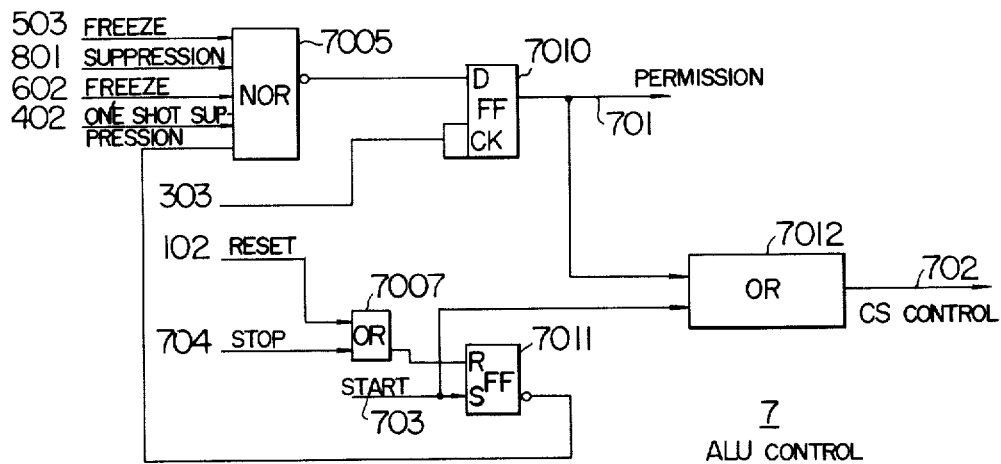
FIG. 3 shows in a circuit diagram a circuit configuration of an ALU control circuit of the system shown in FIG. 1.

FIG. 3 shows in detail a circuit arrangement of the ALU control circuit 7 shown in FIG. 1. The ALU control circuit 7 includes a flip-flop 7011 which is set by the start signal 703 and reset by the reset signal 102 or the stop signal 704. When the flip-flop 7011 is reset, the permission signal 701 and the CS control signal 702 are suppressed, as will be described hereinafter. In the following, the state in which the signals 701 and 702 are suppressed because of the flip-flop 7011 being reset will be referred to as the stop state. A flip-flop 7010 stores therein in timing with the clock 303 the arithmetic operation suppressing signal 801 or one of the freeze signals 503 or 602 or the one-shot suppression signal 402 or the inverted output signal of a flip-flop 7011 through a NOR gate 7005. Accordingly, the permission signal 701 outputted from the flip-flop 7010 is suppressed when one of the arithmetic operation suppressing signal 801, the freeze signal 503 and 602 and the one-shot suppression signal 402 is logic "1" or when the flip-flop 7011 is in the reset state. In response to either the output signal from the flip-flop 7010 or the start signal 703, a CS control circuit 7012 known per se produces the CS control signal 702. Thus, the signal 702 is excited when the permission signal 701 is not suppressed or when the start signal 703 is inputted in the suppressed state of the suppression signal 701.

Figure 5:
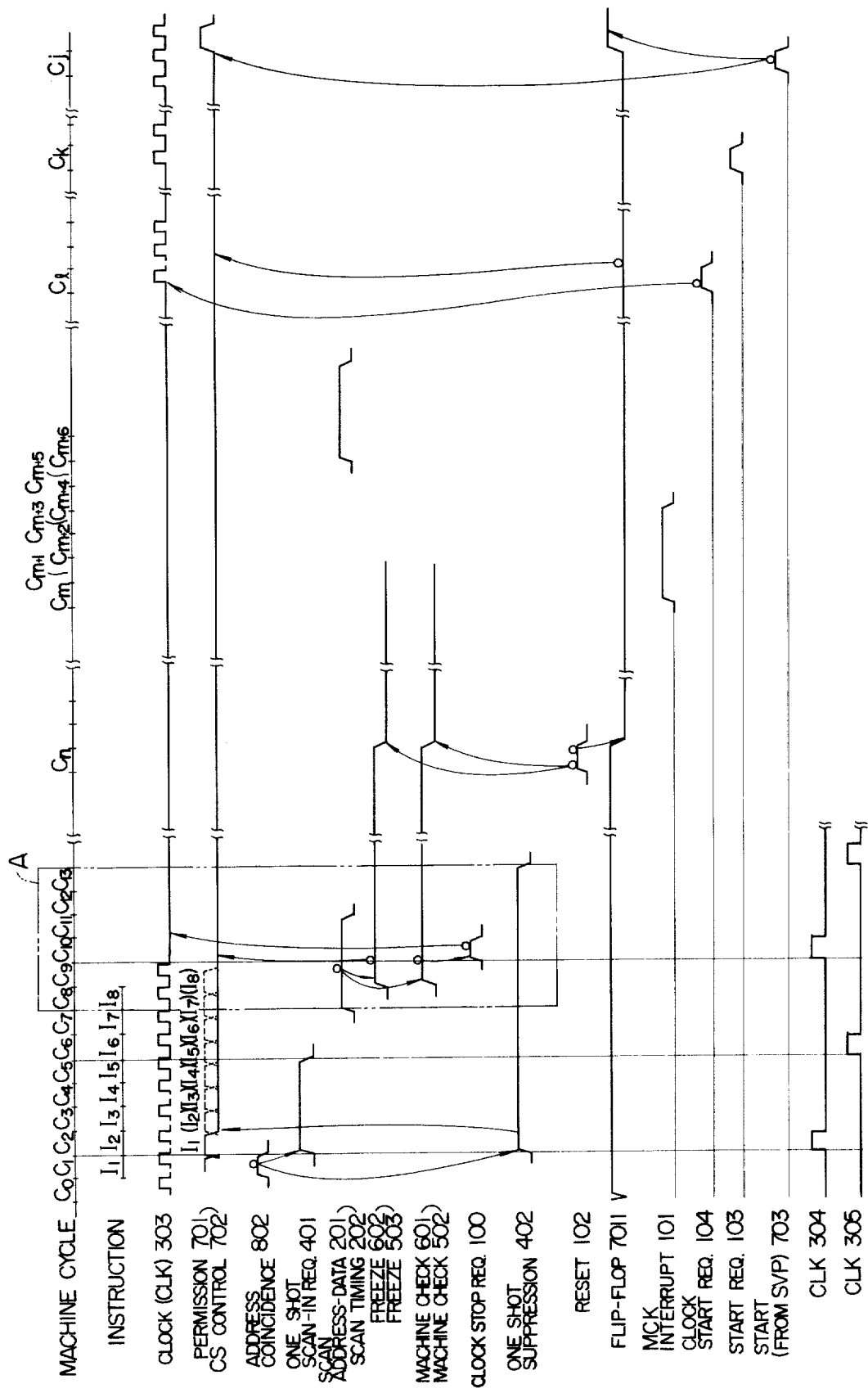
FIG. 5 illustrates in a time chart operations of the system shown in FIG. 1 taking place on certain conditions.

In the following, the operation of the system shown in FIG. 1 will be described with the aid of a flow chart shown in FIG. 4 and timing chart illustrated in FIG. 5. For the convenience of explanation, it is assumed that $I_1$, $I_2$ and so forth represent an instruction sequence each of which is completely executed within a single machine cycle.

When the one-shot scan function is to be employed, the one-shot scan mode is previously set in the service processor or SVP which then transmits this one-shot scan mode to the one-shot scan circuit 4 through a line 803. Further, the address coincidence signal 802 is transmitted to the one-shot scan circuit 4 from the instruction unit (not shown) in a machine cycle C1. The signal 802 is a pulse signal which indicates that the address of the instruction set previously in the instruction unit coincides with the address for the instruction next to be executed and which signal has heretofore been used to serve for maintenance functions such as debugging and the like. Accordingly, the signal 802 can be produced by using a known circuit (not shown). In the case of the exemplary embodiment now being described, it is assumed that the pulse signal 803 is produced when the instruction $I_1$ is decoded or interpreted. When the address coincidence signal 802 is produced in the state in which the one-shot scan mode signal 803 is present, the one-shot scan circuit 4 responds to these signals 802 and 803 to thereby produce the one-shot scan-in request signal 401 and the one-shot suppression signal 402. The one-shot scan-in request signal 401 is outputted for four cycles starting from the beginning of the machine cycle C2, while the one-shot suppression signal 402 is outputted continuously for a period covering the machine cycles C2 to C13. The ALU control unit 7 responds instantaneously to the suppression signal 402 and suppresses the permission signal 701 and the CS control signal 702 starting from the cycle C3 by means of the flip-flop 7010 and the CS control circuit 7012, respectively. So long as these signals 701 and 702 are suppressed, the operations of the ALU 6 and CS 5 are inhibited. As a consequence, although the instruction $I_1$ is executed in the cycle C2, executions of the subsequent instructions $I_2$, $I_3$ and so forth are inhibited. The one-shot scan circuit 4 is so arranged that the one-shot suppression signal 402 is excited for a period of a sufficient duration for covering a time span between the address coincidence signal 802 and the inhibition of operations of the ALU 6 and the CS 5 brought about by the freeze signal 503 or 602 in response to occurrence of failure brought about by the scan-in operation described below (i.e., until the cycle C9 or C12 shown in FIG. 5 in the case of the embodiment being now described).

Figure 6:
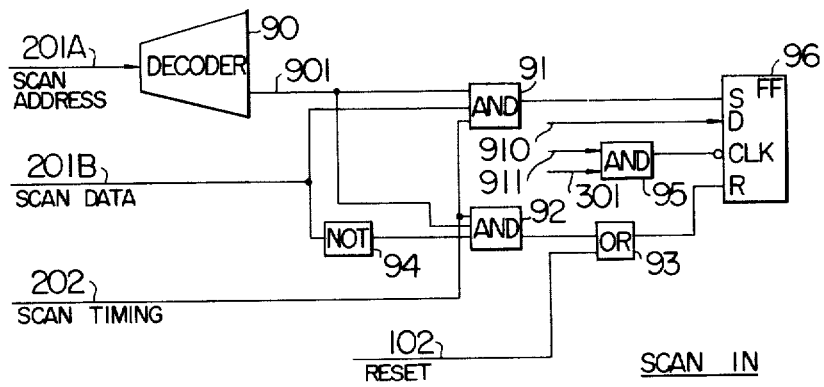
FIG. 6 shows a circuit configuration of a scan-in circuit for a flip-flop.

Consideration will now be given to the case where a certain flip-flop in the ALU 6 is subjected to the scan-in operation to thereby bring about a failure. In response to the one-shot scan-in request signal 401, the scan control unit 2 initiates a known scan-in operation in accordance with the one-shot scan address and data supplied from the service processor along a line 2000. The scan control circuit 2 responds to the scan-in request signal 401 in the cycle C4 with a delay of two cycles from the time point (cycle C2) at which the same signal 401 is generated, and supplies during a period from the cycle C8 to C11 with a delay of four cycles the scan address signal 201A, the data signal 201B and the scan timing signal 202 to a flip-flop in which the failure is to take place. In FIG. 6, a flip-flop 96 as shown represents in the non-limiting sense one of the flip-flops used in the CS 5 or ALU 6. The scan address 201A is decoded by a decoder 90 whose output line 901 is thus excited. When the scan data is logic "1", the flip-flop 96 is set to "1" through an AND gate 91. On the other hand, when the scan data is "0", the flip-flop 96 is reset through an inverter 94, an AND gate 92 and an OR gate 93. By the way, signals 910 and 911, a clock signal 301 and an AND gate 95 are used to set data at the flip-flop 96 in the normal operation. In particular, the signal 910 represents data, while the signal 911 represents a setting command. Further, the flip-flop 96 is adapted to be reset when a reset signal is applied later to the input terminal R through the OR gate 93. When this flip-flop 96 is selected as the one in which failure is to take place, a failure occurs in the ALU 6 or CS 5 which incorporates this flip-flop 96. The ALU 6 or CS 5 in which the failure occurs will then produce a machine check signal (MCK) 601 or 502 which is transmitted to a machine check control unit 1. At the same time, the freeze signals 602 and 503 are produced and sent to the ALU control circuit 7.

The time point at which the failure occurs depends on the length of a transmission path extending between the flip-flop at which the failure is to take place and the scan control circuit 2. In the case of the example illustrated in FIG. 5, it is assumed that a time span between the start of the scan-in operation and the occurrence of failure is relatively short, whereby the machine check signal 601 or 502 and the freeze signal 602 or 503 are excited in the cycle C9.

The machine check control unit 1 responds to the mchine check signal 601 or 502 and produces a clock stop request signal 100 in the succeeding machine cycle C10. In response to the clock stop signal 100, the clock generator 3 stops generation of the clock signals 301, 302, 303, 304 and 305 in succeeding machine cycles inclusive of the next cycle C11.

When generation of these clock signals is thus stopped, the state of the flip-flop incorporated in the ALU 6 or the CS 5 is prevented from being changed. However, the reset operation which will hereinafter be described can be effected in the absence of the clock.

Thus, the output of the flip-flop 7010 remains unchanged until generation of the clock is restored. More specifically, the flip-flop 7010 continues to output logic "0" until the cycle C10 inclusive thereof in response to the one-shot suppression signal 402. Accordingly, in the succeeding cycles C11 and so forth during which the generation of clock signals is stopped, the flip-flop 7010 continues to produce "0" as the output thereof. Consequently, both the permission signal 701 and the CS control signal 702 continue to be suppressed during the period in which generation of clock signals is stopped. On the other hand, the machine check control circuit 1 subsequently logs out the concerned flip-flop (not shown) and excites subsequently the reset signal 102 in the succeeding cycle Cn where n > 16, which reset signal 102 is then transmitted to the CS 5, the ALU 6 and the ALU control circuit 7. In response to the reset signal 102, the ALU 6 resets internal flip-flops and at the same time resets the machine check signal 601 and the freeze signal 602. On the other hand, the CS 5 responds to the reset signal 102 to thereby reset the machine check signal 502 and the freeze signal 503. In the ALU control circuit 7, the flip-flop 7011 is reset through the OR-gate 7007 in response to the reset signal 102. The machine check control circuit 1 produces subsequently the machine check interrupt signal 101 in the cycle Cm where m > n. The scan control circuit 2 responds to the signal 101 to send to the CS 5 a scan address signal for a CS address register (not shown), data representing a start address of a machine check processing microprogram and the scan timing signal through the lines 201A, 201B and 202, respectively, whereby the start address is loaded in a CS address register (not shown) in the cycle Cm+6. Thereafter, a clock start request signal 104 is produced in the cycle Cl (where l > m) and supplied to the clock generator 3 which then restores generation of the clock signals 301, 302, 303, 304 and 305. However, the permission signal 701 and the CS control signal 702 continue to be suppressed independent of the restored generation of the clock signals, because the flip-flop 7011 is in the reset state. Subsequently, the machine check control circuit 1 produces the start request signal 103 in the cycle Ck (where k > l) for clearing the stop state, which signal 103 is sent to the service processor or SVP (not shown). In response to the signal 103, the SVP sends the start signal 703 to the ALU control circuit 7 in the cycle Cj (where j > k). The control circuit 7 then responds to the start signal 703 to set the flip-flop 7011, resulting in the flip-flop 7010 and the CS control circuit 7012 producing the micro-instruction permitting signal 701 and the CS control signal 702. As a consequence, the machine check processing microprogram is activated, whereby the ALU 6 executes a failure processing and the machine check interrupt processing in accordance with the microinstruction 501. In this manner, since the designated failure can be accurately produced in the course of executing a specified instruction contained in the program to thereby issue the machine check interrupt, not only the test of the RAS mechanism of the hardware but also the test as to the restoring function of the machine check processing program comprised of machine instructions can be conducted in a facilitated manner.

In the foregoing description, it has been assumed, by way of example, that the machine check signal 601 or 502 and the freeze signal 602 or 503 are issued in the machine cycle C9. However, there may arise such a case where the machine check signal 601 or 502 and the freeze signal 602 or 503 are produced only with a delay due to the fact that the transmission paths for the signals 201 and 202 are long. Operaton in such a situation will be described by referring to FIG. 7 in which only a major portion corresponding to the portion shown in FIG. 5 as enclosed by a broken line block A is illustrated on the assumption that the machine check signal 601 or 502 are excited in the cycle C12 and at the same time one of the freeze signals 602 or 503 is outputted to the ALU control circuit 7 which has already responded to the signal 402 to thereby suppress the permission signal 701 and the CS control signal 702. In the cycles succeeding the cycle C14, the input signal 402 is absent. However, the signals 701 and 702 are notwithstanding suppressed, because the signal 503 or 602 have been inputted, as described above. The machine check control unit 1 responds to the inputted machine check signal 601 or 502 to thereby excite the clock stop request signal 100 in the cycle C14. In this connection, it should be noted that assumption is made that the clock stop request signal 100 is excited with a delay corresponding to one cycle after generation of the signal 601 or 502 (in FIG. 7) as compared with the case illustrated in FIG. 5, because an increased time is required for the machine check signal 601 or 502 to reach the machine check control unit 1. The clock generator responds to the signal 100 by stopping generation of the clock signals 301, 302, 303, 304 and 305 in the cycles C15 et seq. Thus, the permission signal 701 and the CS control signal 702 are suppressed by the signal 402 until the cycle C13, by the signal 503 or 602 in the cycle C14 and by the absence of the clock signals 301, 302, 303, 304 and 305 in the cycles C15 et seq. Subsequent operation is effected in the manner similar to the case described hereinbefore in conjunction with FIG. 5.

As will be apparent from the foregoing description, when the one-shot suppressing signal 402 can not be utilized, the address coincidence signal 802 is generated, to which the one-shot scan circuit 4 responds to thereby produce the one-shot scan-in request signal 401, whereby the scan-in operation is effected under the control of this signal 401 to inhibit subsequently the operations of the ALU and the CS. Thus, about 10 cycles will usually be required for the operations of the ALU and the CS to be inhibited in succession to the generation of the address coincidence signal. In accordance with the teaching of the present invention, the one-shot suppression signal 402 is used so that the ALU 6 and the CS 5 are inhibited immediately after generation of the address coincidence signal, wherein the ALU 6 and the CS 5 are inhibited temporarily by the signal 402, which is followed by inhibition through the scan control circuit 2. Thus, the pulse width of the one-shot suppression signal may be so selected as to be longer than the maximum time span involved between generations of the address coincidence signal and the freeze signal 602 and 503.

As will be appreciated from the foregoing, the pseudo failure can be produced in the one-shot scan mode at the time when a designated instruction is executed by virtue of such arrangement that the signal for inhibiting the operations of the ALU and the CS is generated in response to the address coincidence signal independent of the scan-in controlling circuit according to the invention.

What is claimed is:

1. A data processing system having a function of scanning-in pseudo-failure data so as to investigate the operating condition of the system comprising:

operation executing means for executing operations while receiving a permission signal, including a plurality of flip-flops and means for producing a freeze signal when failure occurs in said operation executing means as indicated by a condition of at least one of said flip-flops;

scan control means for scanning-in said pseudo-failure data into said flip-flops in said operation executing means to produce a pseudo-failure condition therein and cause generation of said freeze signal;

operation control means for supplying said permission signal to said operation executing means and including means responding to said freeze signal for inhibiting application of said permission signal to said operation executing means so that said operation executing means is caused to pause in its operation; and signal providing means responding to a signal ordering generation of said pseudo-failure condition for providing a one-shot scan-in request signal to said scan control means to start a scan-in operation of said pseudo-failure data and providing a one-shot suppression signal to cause operation of said inhibiting means in said operation control means, said one-shot suppression signal having a pulse width covering a time span extending until after a time point at which said operation executing means produces said freeze signal in response to said scan-in operation.

2. A data processing system according to claim 1. further comprising machine check controlling means for activating execution of a failure processing operation upon occurrence of failure in said operation executing means, wherein said operation executing means includes means for generating a machine check signal for activating said machine check control means in addition to said freeze signal when failure occurs in said operation executing means.

3. A data processing system according to claim 2, wherein said operation executing means includes arithmetic operation means and storage control means for controlling said arithmetic operation means in accordance with previously stored microinstructions, said arithmetic operation means and said storage control means each including means for producing, respectively, said freeze signal and said machine check signal upon occurrence of internal failure;

means for supplying a clock signal to said operation executing means to control operation thereof;

said machine check control means including means for responding to said machine check signal by inhibiting said clock signal from being supplied to said operation executing means; means for logging out the outputs from flip-flops included in said operation executing means and said storage control means; reset means for resetting said flip-flops included in said operation executing means following said logging out operation; means for commanding said scan control means to scan a start address of said failure processing micro-instruction routine in said storage control means following said resetting operation; means for clearing inhibition of supply of said clock signal following said scan-in operation of said start address; and execution initiating request means for issuing a request signal for initiation of execution of operation following said clearing of inhibition operation; and said operation control means including a first flip-flop which is set to a first state by a reset signal outputted from said reset means and responds to said execution initiating request signal to be set to a second state in response to a start signal supplied externally; and said inhibiting means comprises means for producing a signal to inhibit operation of said operation executing means in response to said freeze signal, said suppression signal or an output signal produced by said first flip-flop when said first flip-flop is in said first state.

4. A data processing system according to claim 3, wherein said inhibiting means includes an OR gate having inputs supplied with said freeze signal, said suppression signal and said output signal produced from said first flip-flop in said first state; a second flip-flop for storing therein the output signal from said OR gate in response to a first clock signal utilized for controlling said operation executing means and producing as the output signal said inhibit signal which is supplied to said arithmetic operation means; and fourth means having inputs supplied with the output signal from said second flip-flop and said start signal for applying an operation inhibiting signal to said control storage means during a given time span except for the time in which said second flip-flop does not output said inhibit signal or said start signal is being inputted.

5. A data processing system according to claim 2, wherein said operation control means includes an OR gate having inputs supplied with said freeze signal and said suppression signal, and a flip-flop for storing an output signal from said OR gate in response to a clock signal utilized for controlling operation of said operation executing means and for sending out a signal commanding said inhibition; said machine check control means including means for inhibiting supply of said clock signal in response to said machine check signal.

6. A data processing system according to one of claims 3 or 4, including means for issuing said ordering signal when an address portion of the instruction coincides with a predetermined address.

7. A data processing system according to claim 1, wherein said signal providing means includes a flip-flop which responds to a first clock signal having a longer period than a second clock signal for controlling said operation executing means.

8. A date processing system according to claim 7, wherein said signal providing means includes a first flip-flop which is set by said ordering signal; a second flip-flop for storing the output of said first flip-flop in response to said second clock signal; a third flip-flop responding to a third clock signal which has the same period as that of said first clock signal and is out of phase with said first clock signal by half of said period, said third flip-flop producing an output signal to reset said first flip-flop; and an OR gate having inputs supplied with output signals from said first, second and third flip-flops for producing as an output said inhibiting signal.

9. A data processing system according to claim 8, wherein said scan control means comprises means for performing said scan-in operation in response to an output signal from an AND gate which has inputs supplied with the output from said second flip-flop and an inverted output of said third flip-flop.

10. A data processing system according to one of claims 7 to 9, wherein said operation control means includes an OR gate having inputs supplied with said freeze signal and said suppression signal, and a flip-flop for storing the output of said OR gate in response to said first clock signal and for producing said inhibition commanding signal.

* * * * *